United States Patent [19]

Verkuil

[11] Patent Number: 5,767,693

[45] Date of Patent: Jun. 16, 1998

[54] METHOD AND APPARATUS FOR MEASUREMENT OF MOBILE CHARGES WITH A CORONA SCREEN GUN

[75] Inventor: Roger L. Verkuil, Wappinger Falls, N.Y.

[73] Assignee: Smithley Instruments, Inc., Cleveland, Ohio

[21] Appl. No.: 706,459

[22] Filed: Sep. 4, 1996

[51] Int. Cl.$^6$ .......................... G01R 31/26; G01R 31/28
[52] U.S. Cl. .......................... 324/767; 250/492.2
[58] Field of Search .......................... 324/767, 765–769, 324/501, 455, 750; 250/492.2

[56] References Cited

U.S. PATENT DOCUMENTS

| | | | |
|---|---|---|---|
| Re. 29,918 | 2/1979 | Verkuil | 417/459 |
| 3,206,674 | 9/1965 | Thuy et al. | 324/766 |
| 3,456,109 | 7/1969 | Gawron | 250/326 |
| 3,748,579 | 7/1973 | Henry et al. | 554/72 |
| 4,049,343 | 9/1977 | Hermanson | 599/131 |
| 4,326,165 | 4/1982 | Szedon | 324/455 |
| 4,464,627 | 8/1984 | Munakata et al. | 324/765 |
| 4,542,434 | 9/1985 | Gehlke et al. | 361/231 |
| 4,544,887 | 10/1985 | Kamieniecki | 324/752 |
| 4,563,642 | 1/1986 | Munakata et al. | 324/752 |
| 4,599,558 | 7/1986 | Castellaon, Jr. | 324/752 |
| 4,663,526 | 5/1987 | Kamieniecki | 250/315.3 |
| 4,704,576 | 11/1987 | Tributsch et al. | 324/751 |
| 4,780,680 | 10/1988 | Reuter et al. | 324/455 |
| 4,792,680 | 12/1988 | Lang et al. | 250/325 |
| 4,800,337 | 1/1989 | Cox et al. | 324/455 |
| 4,809,127 | 2/1989 | Steinman et al. | 361/213 |
| 4,812,756 | 3/1989 | Curtis et al. | 324/750 |
| 4,816,755 | 3/1989 | Look et al. | 324/765 |
| 4,827,212 | 5/1989 | Kamieniecki | 324/765 |
| 4,827,371 | 5/1989 | Yost | 361/213 |
| 4,873,436 | 10/1989 | Kamieniecki et al. | 250/315.3 |
| 4,891,584 | 1/1990 | Kamieniecki et al. | 324/752 |
| 4,901,194 | 2/1990 | Steinman et al. | 361/213 |
| 4,951,172 | 8/1990 | Steinman et al. | 361/213 |
| 4,956,603 | 9/1990 | Russo | 324/767 |
| 5,025,145 | 6/1991 | Logowski | 250/214 R |
| 5,055,963 | 10/1991 | Partridge | 361/231 |
| 5,087,876 | 2/1992 | Reiss et al. | 324/767 |
| 5,091,691 | 2/1992 | Kamieniecki et al. | 324/765 |
| 5,202,018 | 4/1993 | Horanyi et al. | 205/655 |
| 5,216,362 | 6/1993 | Verkuil | 324/767 |
| 5,266,892 | 11/1993 | Kimura | 324/767 |
| 5,343,293 | 8/1994 | Berger et al. | 356/369 |
| 5,406,214 | 4/1995 | Boda et al. | 324/765 |
| 5,453,703 | 9/1995 | Goldfarb | 324/765 |
| 5,498,974 | 3/1996 | Verkuil | 324/767 |
| 5,594,247 | 1/1997 | Verkuil | 50/326 |

FOREIGN PATENT DOCUMENTS 1122982  11/1984  U.S.S.R.

OTHER PUBLICATIONS

"Rechargable Magnesium Power Cells", Lyndon B. Johnson Space Center, Houston, Texas, Feb. 95.

R.B. Comizzoli, "Uses of Corona Discharges in the Semiconductor Industry", J. electrochem. Soc: Solid–State Science and Technology, Feb. 1987, pp. 424–429.

P. Edelman, "New Approcah to Measuring Oxide Charge and Mobile Concentration", Optical Characterization Techniques for High–Performance Microelectronic Device manufacturing, SPIE vol. 2337, pp. 154–164, Mar. 1994.

B.H. Yun, "Direct Measurment of Flat–Band Voltage in MOS by Infared Excitation", (Received 25 May 1972), pp. 194–195.

R.G. Vyverberg, "VII. Charging Photoconductive Surfaces", Xerography and Related Processes, pp. 201–206.

"Measuring Work Functions of xDirty' Surfaces With a Vibrating Capacitive Probe", Langley Research Center, Hampton, Virginia, (NASA Tech Briefs, Feb., 1995).

Primary Examiner—Ernest F. Karlsen
Assistant Examiner—Anh Phung
Attorney, Agent, or Firm—Pearne, Gordon, McCoy and Granger LLP

[57] ABSTRACT

The surface of a wafer is charged with corona passing through a screen. The screen is part of a feedback loop that forces a constant corona current. This results in the potential of the wafer surface following the potential of the screen. This allows contemporaneous measurement of the surface charge and potential that are used to measure mobile charge in an oxide layer on the wafer.

2 Claims, 2 Drawing Sheets

METHOD AND APPARATUS FOR MEASUREMENT OF MOBILE CHARGES WITH A CORONA SCREEN GUN

BACKGROUND OF THE INVENTION

The present invention relates to the field of semiconductor wafer testing and, more particularly, to a non-contact method for testing such wafers.

U.S. Pat. No. 5,498,974, which is incorporated herein by reference, teaches a method and apparatus for measuring mobile charge in an oxide layer on semiconductor wafer using corona charge.

A corona gun is used to deposit a measured quantity of charge on the oxide surface and then a Kelvin probe is used to measure the potential of the oxide surface. The wafer is alternately situated under the corona gun and then under the Kelvin probe until a series of values of potentials are reached.

The mobile charge measurement is based on the difference between the actual charge required to achieve a desired potential and the theoretical amount of charge required for zero mobile charges.

While providing good results, this method requires the repeated interchanging of the corona gun and Kelvin probe. This results in substantial delays in the measurement process, as well as providing opportunities for various errors.

SUMMARY OF THE INVENTION

An apparatus for measuring the relative potential of a surface while depositing charges thereon includes a corona source for providing the charges, a chuck for receiving the surface, a screen between the corona source and the chuck, and a potential source. The potential source is adapted to adjust a potential between the screen and the chuck to provide a constant current of the charges between the screen and the chuck, wherein the adjustable potential corresponds to the relative potential. The apparatus also includes a measuring unit for measuring said adjustable potential.

A method for measuring mobile charge in a dielectric layer on a heated semiconductor wafer includes applying corona charges having a first polarity to a surface of the layer until the surface has a potential at least as much as a first potential value.

Also, it includes applying corona charges having an opposite polarity to the first polarity to the surface while repeatedly measuring a first parameter indicative of the quantity of the opposite polarity charges and contemporaneously measuring a second parameter indicative of the surface potential until the surface has a potential at least as much as a second potential value.

It further includes applying corona charges having the first polarity to the surface while repeatedly measuring a third parameter indicative of the quantity of the first polarity charges and contemporaneously measuring a fourth parameter indicative of the surface potential until the surface has a potential at least as much as a third potential value, and determining the mobile charge from the measured parameters.

DESCRIPTION OF THE PREFERRED EMBODIMENTS

Figure 1:
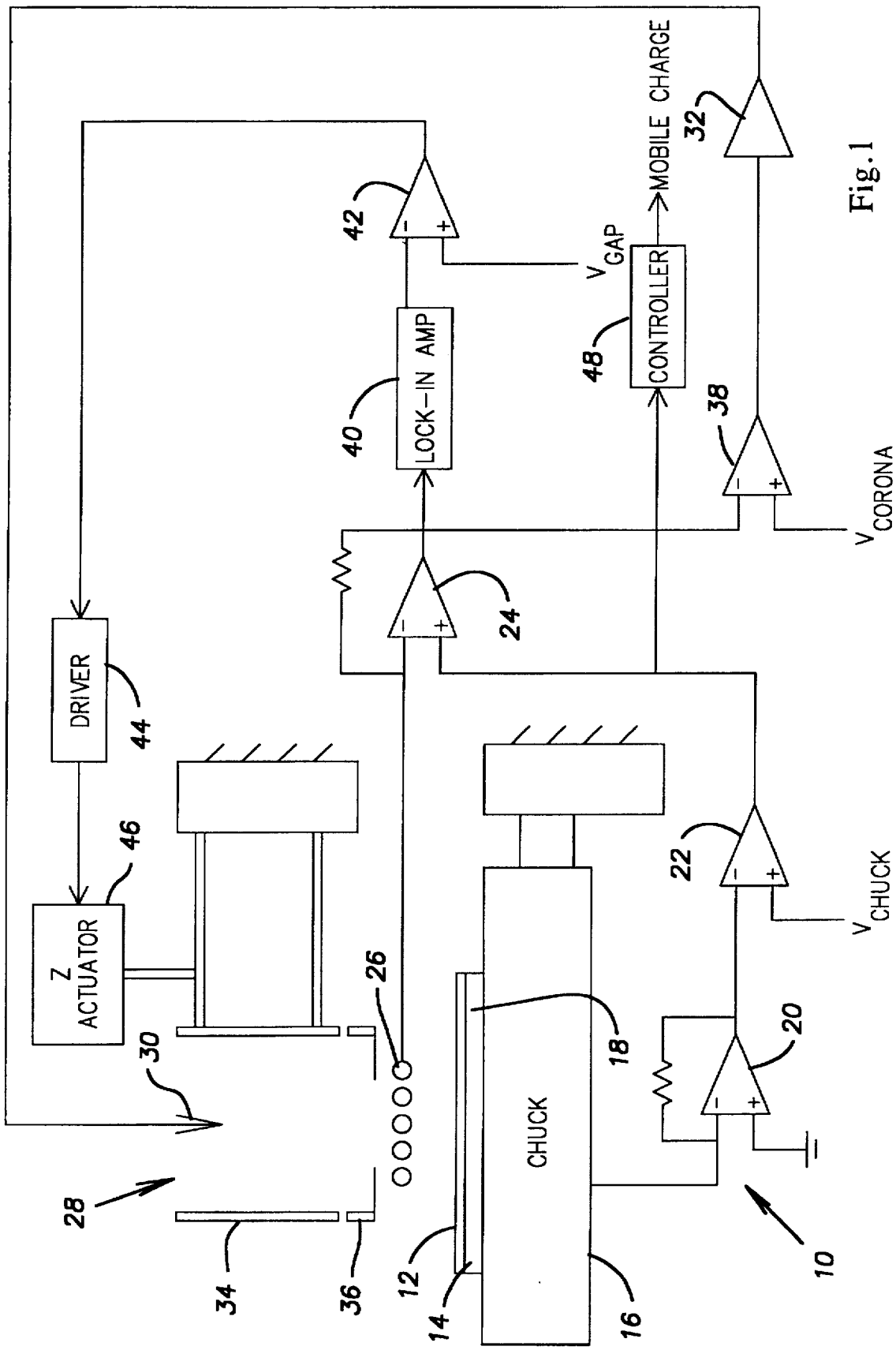
FIG. 1 is a schematic diagram of an apparatus for measuring mobile charge according to the invention.

Referring to FIG. 1, an apparatus 10 for measuring mobile charge concentration in a dielectric layer 12 on a semiconductor wafer 14 includes a chuck 16. The bulk 18 of the wafer 14 may be, for example, silicon, and the dielectric layer 12 an oxide thereof.

In the preferred embodiment, the chuck 16 is heated and maintains the wafer 14 at a temperature between 200°–300° C. (e.g., 200° C.). It would also be possible, as an alternative, to maintain the entire testing area at the desired temperature.

The chuck 16 is in electrical communication with the bulk 18 of the wafer 14. In the preferred embodiment this communication is with a scratch contact, but non-contact methods are also possible.

Current flowing through the chuck 16 flows to a current to voltage converter 20. The converter 20 may be, for example, a differential op-amp with a resistive feedback and the non-inverting input tied to ground. The value of the voltage output from the converter 20 corresponds to the current from the chuck 16. The voltage output from the converter 20 is directed to inverting input of a differential amplifier 22. The non-inverting input of the amplifier 22 is connect to a reference voltage $V_{Chuck}$ that, as will be seen, establishes the value of the current through the chuck 16. The output of the amplifier 22 is connected to the non-inverting input of a differential amplifier 24. The inverting input of the amplifier 24 is connected to a conductive screen 26 located between a corona source 28 and the wafer 14. The output of the amplifier 24 is fed back by a resistor to force the inverting input to the same potential as the output of the amplifier 22.

The screen 26 may be, for example, an 8 mils thick stainless steel sieve with holes having a nominal diameter of 9 mils on 15 mils centers. In the preferred embodiment, the holes flare towards the wafer 14.

The corona source 28 may include, for example, one or more tungsten needles 30 connected to a high voltage amplifier 32 (6–9 KV, the polarity of the corona ions are determined by the polarity of the high voltage). The needle 30 is surrounded by a cylindrical upper electrode 34 connected to an unshown high voltage (1.5 KV). A cylindrical mask electrode 36 with a partially closed end is connected the screen 26.

Further description of possible embodiments of the corona source 28 and the screen 26 are contained in U.S. patent application Ser. No. 08/499,326, filed Jul. 7, 1996, now U.S. Pat. No. 5,594,247, which is incorporated herein by reference.

The output of the amplifier 24 is also provided to the inverting input of a differential amplifier 38. The non-inverting input of the amplifier 38 is connected to a reference voltage $V_{Corona}$ that, as will be seen, establishes the voltage of the corona needle 30 to insure sufficient corona to support the desired current through the chuck 16. The output of the amplifier 38 controls the output of the high voltage amplifier 32.

The output of the amplifier 24 is also provided to a lock-in amplifier 40. The output of amplifier 40 is connected to the inverting input of a differential amplifier 42. The non-inverting input of the amplifier 42 is connected to a reference voltage $V_{Gap}$ that, as will be seen, establishes the distance (e.g., 5–10 mils) between the corona source 28 and the top surface of the wafer 14. The output of the amplifier 42 controls a driver circuit 44 that controls the distance between the corona source 28 and the top surface of the wafer 14 by means of a vertical translation actuator 46.

The output of the amplifier 22 is also provided to the controller 48 which uses the value of the signal to determine the mobile charge. The controller 48 may be, for example, a microprocessor-based computer system with analog to digital conversion of the voltage signal (digital voltmeter) from the amplifier 22.

In operation, there are three servo loops. The first controls current in the form of corona charge being applied to the surface of the wafer 14. As the surface charge of the wafer increases (or decreases depending on the polarity of the ions) the surface potential of the wafer 14 changes to approach that of the screen 26. If the potential of the screen 26 and the wafer 14 are the same, no more ions pass would pass the screen 26, thus the potential of the screen 26 can control the charge deposited on the wafer 14 and, thus, the current through the chuck 16.

The feedback loop of the amplifiers 20, 22, 24 forces the screen 26 to maintain a constant corona current between the screen 26 and the surface of the wafer 14 as determined by the value of $V_{Chuck}$.

It should be noted that if the corona current is held constant then the voltage of the screen $V_s$ is also constant with respect to the potential of the surface of the wafer 14. This is because the air gap between the screen 26 and the wafer 14 is then essentially a resistance. As a result, the potential of the wafer surface will match $V_s$, but offset by a fixed amount (e.g., about a volt) as long as the current (and the resistance) is held constant.

The second feedback loop controls the amount of corona produced by the corona source 28. The amount of corona produced needs to be sufficient to support the desired current through the chuck 16. It should be noted that the output of the amplifier 24 also corresponds to $V_s$ and thus the chuck current. The feedback loop of the amplifiers 38, 32 ensure that sufficient corona is available for the desired corona current.

The third feedback loop controls the distance or gap between the screen 26 and the surface of the wafer 14. This ensures that the capacitance (and resistance) of the air gap remains constant. A small, unshown ac signal is applied to the screen 26. The lock-in amplifier 40 detects this signal across the gap and by the feedback loop of the amplifiers 24, 40, 42 and the actuator 46 keeps the gap at a value corresponding to the value of $V_{GAP}$.

One aspect of the invention includes recognition that by maintaining the current between the screen 26 and the chuck 16 constant, $V_s$ corresponds to the potential of the surface of the dielectric 12 on the wafer 14, but offset by a fixed amount. $V_s$ thus represents the relative potential of the surface of the dielectric 12. As set forth below, this relative potential can be used to measure mobile charge in the dielectric 12. The method used does not require knowledge of the offset value.

Where positive mobile ions are of interest, applying positive corona charge until the potential of the dielectric surface produces a field across the dielectric of, for example, 1–2 megavolts/cm for one minute "pushes down" all of the positive mobile charge to the boundary between the dielectric 12 and the bulk 18. The value of this first potential can be determined from the approximate dielectric layer thickness divided into the desired electric field. The mobile charges are then in a known state.

Then applying negative corona charge until the potential of the dielectric surface produces a field across the dielectric of, for example, a negative 1–2 megavolts/cm "pulls up" all of the positive mobile charges to the boundary between the dielectric 12 and the air gap. The value of this second potential can be determined from the approximate dielectric layer thickness divided into the desired electric field. The mobile charges are then again in a known state.

Similarly, a positive corona can be used again to "push down" the mobile charges until a third potential is reached (e.g., a positive 1–2 megavolts/cm).

The method of the invention allows measurement of the mobile charge concentration in the dielectric by making measurements during these "push down" and "pull up" operations.

Negative corona charges are applied with the corona source 28 to the surface of the dielectric layer 14 until the surface reaches the first potential value.

Positive corona charges are applied with the corona source 28 to the surface of the dielectric layer 14 until the surface reaches the second potential value. Repeatedly during this process, a first parameter, the time derivative of $V_s$, $dV_s/dt$, is measured contemporaneously with a second parameter, $V_s$.

Negative corona charges are applied with the corona source 28 to the surface of the dielectric layer 14 until the surface reaches the third potential value. Repeatedly during this process, a third parameter, the time derivative of $V_s$, $dV_s/dt$, is measured contemporaneously with a fourth parameter, $V_s$.

The first and third parameters are indicative of the amount of charge deposited on the wafer and the second and forth parameters are indicative of the potential of the surface.

Figure 2:
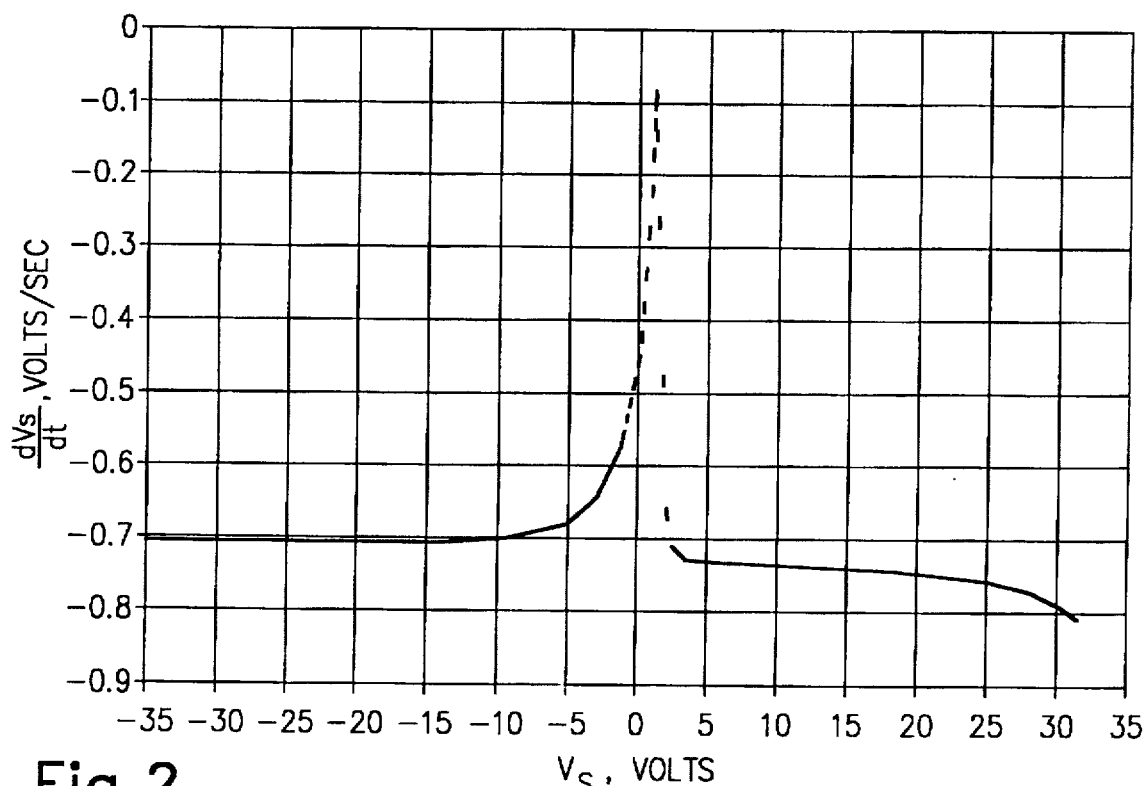
FIG. 2 is an exemplary graph of the change in screen voltage with respect to time plotted versus the screen voltage for the "pull-up" case.

Referring to FIG. 2, an exemplary plot of the first parameter versus the second parameter about the $V_s$ zero point illustrates the effect of rapid movement of mobile charges about the zero point during "pull up".

Figure 3:
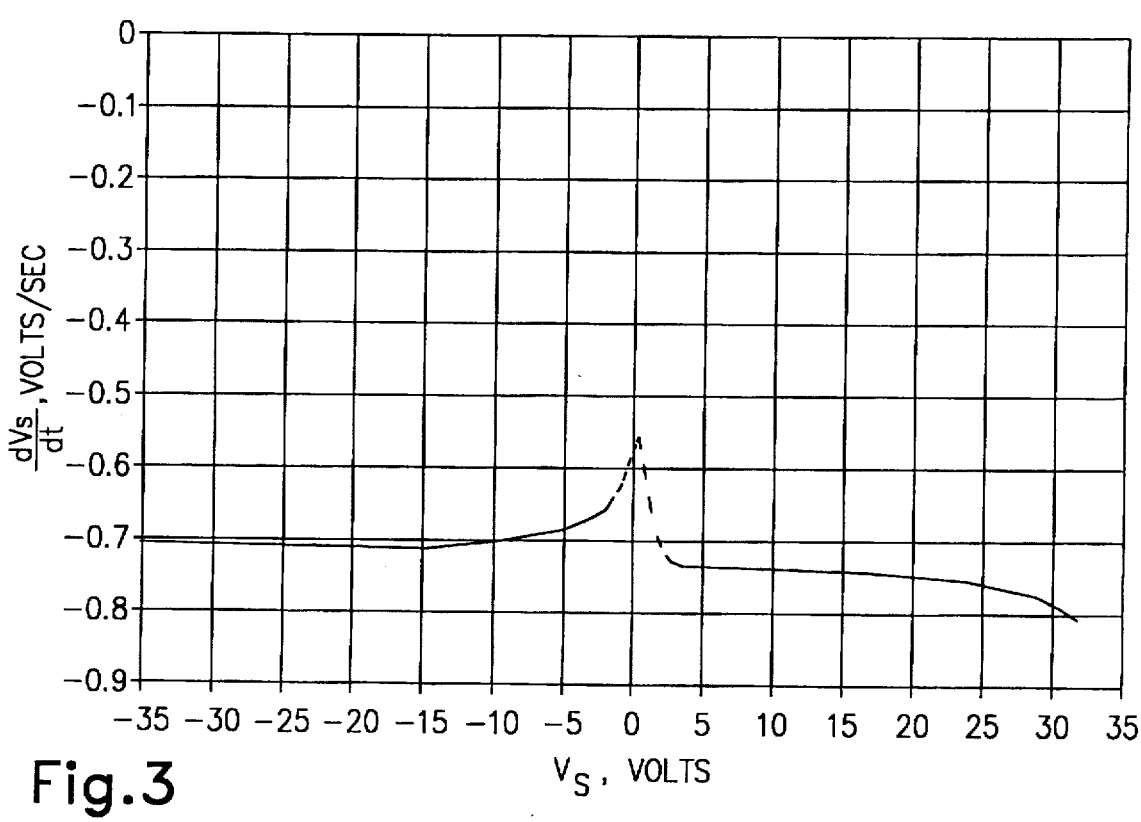
FIG. 3 is an exemplary graph of the change in screen voltage with respect to time plotted versus the screen voltage for the "push-down" case.

Referring to FIG. 3, an exemplary plot of the third parameter versus the fourth parameter about the $V_s$ zero point illustrates the effect of slow movement of mobile charges about the zero point during "push down". This slow movement is the result of the difference in the degree of mobile ion trapping at the dielectric-silicon interface versus the dielectric-air interface. This trapping difference causes the "push down" graph to experience very little influence from ion motion in the vicinity of $V_s$=O. In contrast, the mobile ions have a drastic influence on the "pull up" graph (FIG. 2).

Because of this slow response, the third and fourth parameters can be used to represent adequately the ideal case of no mobile charge carriers.

It should be noted that it is possible to foresee measurements within the scope of the invention where the polarities of the corona, the fields, and the potentials would be reversed.

The controller 48 measures the parameters and uses them to determine the mobile charge. The dip in the first plot is lined up with that of the second plot and the $dV_s/dt$ values converted to corona charging time versus $V_s$ (i.e., the corona current is constant so the time to charge to a voltage is known).

Because the region of interest (a region sufficient to pick up the dip) is closely spaced about $V_s$=O, a small range about this value can be used (e.g., corresponding to a few fractions of megavolts/cm of electric field). The algebraic difference between the curves is taken over the range of interest.

The resulting curve will also have a peak, but now adjusted by using the third and forth parameters as the ideal behavior.

The difference between this curve and a flat curve is the charging time spent replacing mobile charges. The cumulative value of this difference is the total charging time required to replace mobile charges.

The mobile charges are then found by multiplying this total time by the corona deposition rate in charges/cm$^2$-sec.

The accuracy of this method can be improved by iteratively adjusting the aligning of the first and second plots and the relative average slope of the second plot to maximize the resulting curve peak while providing flat tails and by curve fitting a base line to the tails to determine the placement of the flat curve.

The method allows the measurement of mobile charge without contacting the wafer surface. Because the required measurements are made contemporaneously with the charging process faster and more accurate measurements can be made.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A method for measuring mobile charge in a dielectric layer on a heated semiconductor wafer, said method comprising:

applying corona charges having a first polarity to a surface of said layer until said surface has a potential at least as much as a first potential value;

applying corona charges having an opposite polarity to said first polarity to said surface while contemporaneously repeatedly measuring a first parameter indicative of the quantity of said opposite polarity charges and contemporaneously measuring a second parameter indicative of said surface potential until said surface has a potential at least as much as a second potential value;

applying corona charges having said first polarity to said surface while contemporaneously repeatedly measuring a third parameter indicative of the quantity of said first polarity charges and contemporaneously measuring a fourth parameter indicative of said surface potential until said surface has a potential at least as much as a third potential value; and determining said mobile charge from said measured parameters.

2. A method according to claim 1, wherein said first and third parameters are the time differential of the potential of said surface and said second and fourth parameters are the relative potential of said surface.

* * * * *

UNITED STATES PATENT AND TRADEMARK OFFICE
CERTIFICATE OF CORRECTION

PATENT NO. : 5,767,693
DATED : June 16, 1998
INVENTOR(S) : Roger L. Verkuil

It is certified that error appears in the above-identified patent and that said Letters Patent is hereby corrected as shown below:

On the face of the patent, in field [73], delete "Smithley" and insert therefor --Keithley--.

On the face of the patent, in field [56], under Other Publications, line 7, after "Mobile" insert --Ion--.

On the face of the patent, in field [56], under Other Publications, line 15, delete "xDirty'" and insert therefor --'Dirty'--.

Signed and Sealed this

Twenty-fourth Day of November, 1998

Attest:

BRUCE LEHMAN

Attesting Officer

Commissioner of Patents and Trademarks